US010868050B2

(12) United States Patent
Ting et al.

(10) Patent No.: US 10,868,050 B2
(45) Date of Patent: Dec. 15, 2020

(54) BACKSIDE ILLUMINATED IMAGE SENSOR WITH NEGATIVELY CHARGED LAYER

(71) Applicant: Taiwan Semiconductor Manufacturing Co., Ltd., Hsin-Chu (TW)

(72) Inventors: Shyh-Fann Ting, Tainan (TW); Chih-Yu Lai, Tainan (TW); Cheng-Ta Wu, Shueishang Township (TW); Yeur-Luen Tu, Taichung (TW); Ching-Chun Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/590,264

(22) Filed: May 9, 2017

(65) Prior Publication Data

US 2017/0243903 A1  Aug. 24, 2017

Related U.S. Application Data

(63) Continuation of application No. 13/743,979, filed on Jan. 17, 2013, now Pat. No. 9,659,981.
(Continued)

(51) Int. Cl.
*H01L 27/146* (2006.01)

(52) U.S. Cl.
CPC ........ *H01L 27/146* (2013.01); *H01L 27/1463* (2013.01); *H01L 27/1464* (2013.01); *H01L 27/14683* (2013.01)

(58) Field of Classification Search
None
See application file for complete search history.

(56) References Cited

U.S. PATENT DOCUMENTS 7,217,658 B1 *  5/2007  Bayman ................ C23C 16/045
257/17
7,737,520 B2  6/2010  Kanbe et al.
(Continued)

FOREIGN PATENT DOCUMENTS

JP    2008252032 A    10/2008
JP    2008306160 A    12/2008
(Continued)

OTHER PUBLICATIONS

Merriam-Webster Dictionary entry for "around", 2014.
(Continued)

*Primary Examiner* — Davienne N Monbleau
*Assistant Examiner* — Scott R Wilson
(74) *Attorney, Agent, or Firm* — Eschweiler & Potashnik, LLC

(57) ABSTRACT

The present disclosure relates to a semiconductor image sensor device. In some embodiments, the semiconductor image sensor device includes a semiconductor substrate having a first surface configured to receive incident radiation. A plurality of sensor elements are arranged within the semiconductor substrate. A first charged layer is arranged on an entirety of a second surface of the semiconductor substrate facing an opposite direction as the first surface. The second surface is between the first charged layer and the first surface of the semiconductor substrate.

20 Claims, 4 Drawing Sheets

Related U.S. Application Data

(60) Provisional application No. 61/638,139, filed on Apr. 25, 2012.

(56) References Cited

U.S. PATENT DOCUMENTS

| | | |
|---|---|---|
| 2006/0033827 A1 | 2/2006 | Kanbe et al. |
| 2006/0073666 A1 | 4/2006 | Lim et al. |
| 2007/0102736 A1 | 5/2007 | Chuang et al. |
| 2008/0105944 A1 | 5/2008 | Chang et al. |
| 2008/0258188 A1* | 10/2008 | Kao ................. H01L 27/14609 257/292 |
| 2009/0189213 A1* | 7/2009 | Matsuo ................. H01L 27/115 257/324 |
| 2009/0209056 A1 | 8/2009 | Hiyama et al. |
| 2009/0230488 A1* | 9/2009 | Ando ................. H01L 27/1462 257/432 |
| 2010/0060758 A1 | 3/2010 | Oshiyama et al. |
| 2010/0148230 A1 | 6/2010 | Stevens et al. |
| 2010/0295107 A1 | 11/2010 | Tatani |
| 2011/0089312 A1* | 4/2011 | Oshiyama ........... H01L 27/1461 250/208.1 |
| 2011/0101482 A1* | 5/2011 | Meynants ......... H01L 27/14601 257/432 |
| 2011/0121371 A1* | 5/2011 | Sakano ............. H01L 27/14609 257/292 |
| 2011/0175187 A1* | 7/2011 | Ueno .................. H01L 27/1462 257/437 |
| 2012/0080733 A1* | 4/2012 | Doan .................. H01L 27/1463 257/292 |
| 2012/0104523 A1* | 5/2012 | Ikeda ................ H01L 27/14607 257/432 |

FOREIGN PATENT DOCUMENTS

| | | |
|---|---|---|
| JP | 2009188231 A | 8/2009 |
| JP | 2010186818 A | 8/2010 |
| JP | 2010206022 A | 9/2010 |
| JP | 2011151126 A | 8/2011 |
| JP | 2011249461 A | 12/2011 |
| JP | 2012033583 A | 2/2012 |
| JP | 2012038981 A | 2/2012 |
| KR | 20090089790 A | 8/2009 |

OTHER PUBLICATIONS

Non-Final Office Action dated May 29, 2014 for U.S. Appl. No. 13/743,979.
Final Office Action dated Dec. 16, 2014 for U.S. Appl. No. 13/743,979.
Non-Final Office Action dated Mar. 21, 2016 for U.S. Appl. No. 13/743,979.
Final Office Action dated Oct. 5, 2016 for U.S. Appl. No. 13/743,979.
Notice of Allowance dated Jan. 20, 2017 for U.S. Appl. No. 13/743,979.

* cited by examiner

BACKSIDE ILLUMINATED IMAGE SENSOR WITH NEGATIVELY CHARGED LAYER

REFERENCE TO RELATED APPLICATIONS

This Application is a Continuation of U.S. application Ser. No. 13/743,979 filed on Jan. 17, 2013, which claims priority to U.S. Provisional Application No. 61/638,139 filed on Apr. 25, 2012. The contents of the above-referenced matters are hereby incorporated by reference in their entirety.

FIELD

The present disclosure pertains to semiconductor materials and processes, particularly to materials and processes for CMOS image sensors.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One type of IC device is an image sensor device that includes a pixel array (or grid) for detecting light and recording an intensity (brightness) of the detected light. The pixel array responds to the light by accumulating a charge, for example the more light, the higher the charge. The accumulated charge is then used (for example, by other circuitry) to provide a color and brightness for use in a suitable application, such as a digital camera. One type of image sensor device is a backside illuminated (BSI) image sensor device. BSI image sensor devices are used for sensing a volume of light projected toward a backside surface of a substrate (which supports the image sensor circuitry of the BSI image sensor device). The pixel grid is located at a front side of the substrate, and the substrate is thin enough so that light projected toward the backside of the substrate can reach a pixel grid. BSI image sensor devices provide a high fill factor and reduced destructive interference, as compared to front-side illuminated (FSI) image sensor devices. Due to device scaling, improvements to BSI technology are continually being made to further improve image quality of BSI image sensor devices. Although existing BSI image sensor devices and methods of fabricating BSI image sensor devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
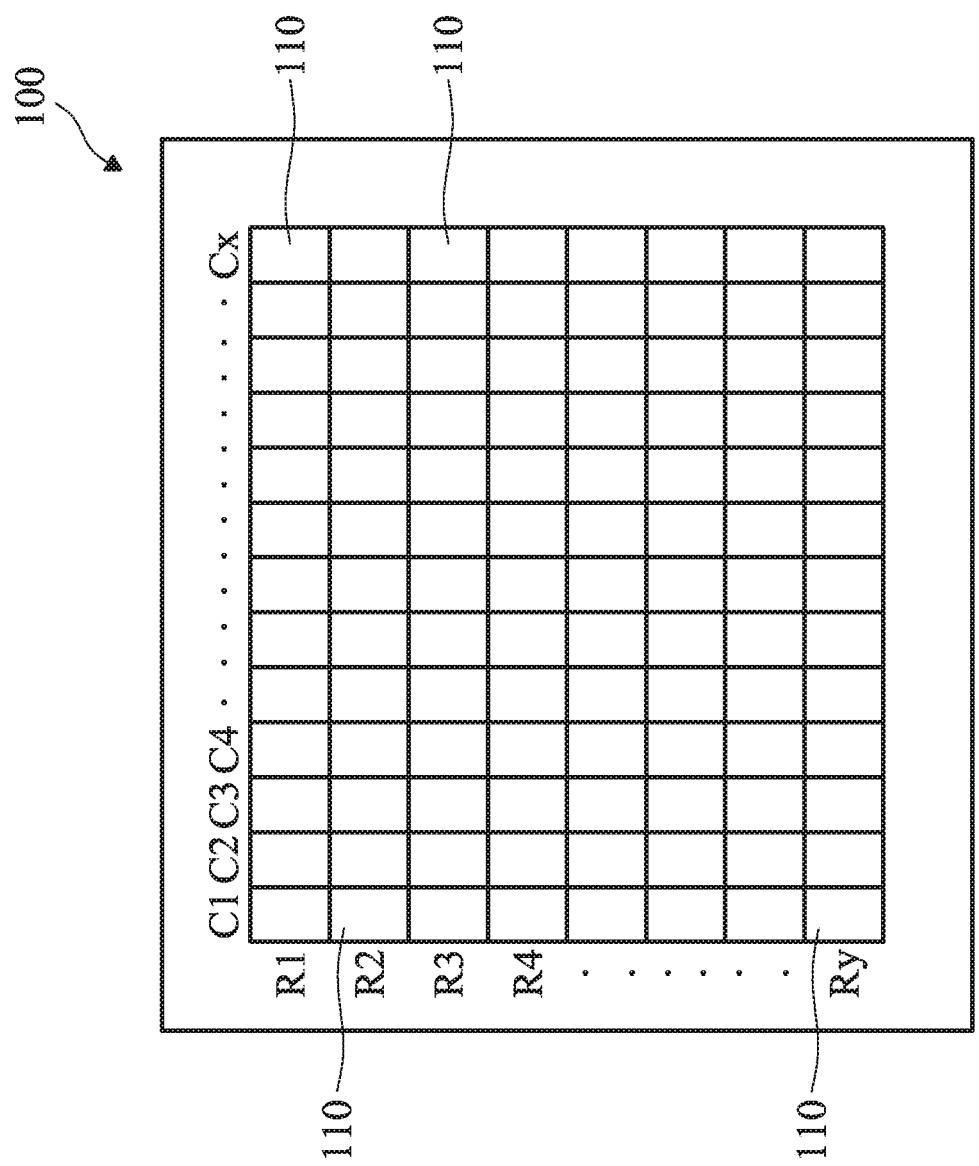
FIG. 1 is a top view of an image sensor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Image sensor designs are improved to minimize current leakage while maintaining good structural integrity and manufacturability. According to various embodiments of this disclosure, a negatively-charged layer is used around radiation-sensing regions in the image sensor. The negatively-charged layer has a greater overall negative charge than traditional dielectric films during and after the device formation process, including before and after a furnace anneal. The negative charge increases hole accumulation at an interface of the negatively-charged layer and creates a depletion region at or close to the interface of the negatively-charged layer and a p-type region of the substrate around the radiation-sensing regions. The depletion region reduces dark current, which is current that flows in the image sensor device in absence of incident light on the image sensor device, and/or white pixels, which occurs where an excessive amount of current leakage causes an abnormally high signal from the pixels.

In many embodiments, the radiation-sensing regions are photodetectors. The negatively-charged layer is placed around the photodetectors in place of one or more dielectric films. In some embodiments, the negatively-charged layer replaces a liner oxide in a shallow trench isolation (STI) feature. In some embodiments, the negatively-charged layer is a sidewall spacer. In some embodiments, the negatively-charged layer is a salicide-block layer or a buffer layer between a salicide-block layer and the p-type region of the semiconductor substrate. In some embodiments, the negatively-charged layer is used as a gate offset spacer for one or more transistors gates placed over photodetectors. The negatively-charged layer can additionally be a backside surface layer on a backside of the semiconductor substrate.

The negatively-charged layer is an oxygen-rich silicon oxide, a high-k metal oxide, or a nitride material. According to one or more embodiments, an oxygen-rich silicon oxide is formed by inductively-coupled plasma-enhanced chemical vapor deposition (ICPECVD) in strongly diluted silane plasmas, low temperature plasma assisted radical oxidation, remotely generated or microwave plasmas. In contrast to a positive charge for thermally grown $SiO_2$, in the negatively-charged layer the net oxide charge is negative and a function of the layer thickness. According to various embodiments, the negative charge is created due to oxidation of the silicon surface by plasma species including neutral oxygen radicals, oxygen ions, and electrons. The net charge is therefore negative under process conditions where plasma oxidation is a major factor. Such process conditions include low deposition rates and relatively thin deposited layers. As a result, the plasma oxidation of the silicon surface results in $SiO_2$ layers with a surplus of oxygen. This $SiO_2$ layer with a surplus of oxygen accumulates a negative charge around 5E9 to around 1E13 per $cm^2$, or greater than about $1E10/cm^2$. In other words, the total charge (Qtot) for the layer is around −5E9 to around −1E13 per $cm^2$, or more negative than about $1E10/cm^2$.

According to one or more embodiments, the negatively-charged layer is a high-k metal oxide. The high-k metal oxide may be an aluminum oxide, magnesium oxide, calcium oxide, hafnium oxide, zirconium oxide, yttrium oxide, tantalum oxide, strontium oxide, titanium oxide, lanthanum oxide, barium oxide or other metal oxides that can form a high-k film using existing semiconductor deposition technologies. The high-k metal oxide may be deposited using a chemical vapor deposition (CVD) technique or a physical vapor deposition (PVD) technique. The CVD process may be a plasma enhanced chemical vapor deposition (PECVD) including ICPECVD, a low pressure chemical vapor deposition (LPCVD), or an atomic layer deposition (ALD) with or without plasma. These processes may be tuned to favor an accumulation of negative charge by varying the process parameters including various flow rates and power parameters and may involve a treatment step after the film deposition to increase negative charge. The resulting high-k metal oxide film may have a oxygen-rich composition with negatively charged interstitial oxygen atoms and/or dangling/broke metal oxide bonds, both of which results in a cumulated negative charge. The cumulated negative charge may be around 5E9 to around 1E14 per $cm^2$, or greater than about $1E10/cm^2$. In other words, the total charge (Qtot) for the layer is around −5E9 to around −1E14 per $cm^2$, or more negative than about $1E10/cm^2$.

According to other embodiments, the negatively-charged layer is a silicon nitride or nitride dielectric. The nitride material may be a nitrogen-rich silicon nitride or other nitrogen-rich dielectric film, such as tantalum nitride, titanium nitride, hafnium nitride, aluminum nitride, magnesium nitride, or other metal nitrides that can be formed using existing semiconductor deposition technologies. The nitride material may be deposited using a CVD technique or a PVD technique. The CVD process may be a PECVD including ICPECVD, an LPCVD, or an ALD with or without plasma. In some embodiments, the negatively-charged layer is a plasma nitrided material. The plasma nitridation may occur during or after film deposition in an after treatment, if a non-plasma deposition technique is used, by using a plasma-containing nitrogen ions. The plasma nitridation creates a nitrogen-rich film with a cumulated negative charge. In some embodiments, the negative charge is increased by a thermal or plasma treatment with ammonia. The cumulated negative charge is around 1E9 to around 1E13 per $cm^2$, or greater than about $5E9/cm^2$. In other words, the total charge (Qtot) for the layer is around −1E9 to around −1E13 per $cm^2$, or more negative than about $5E9/cm^2$.

Figure 2:
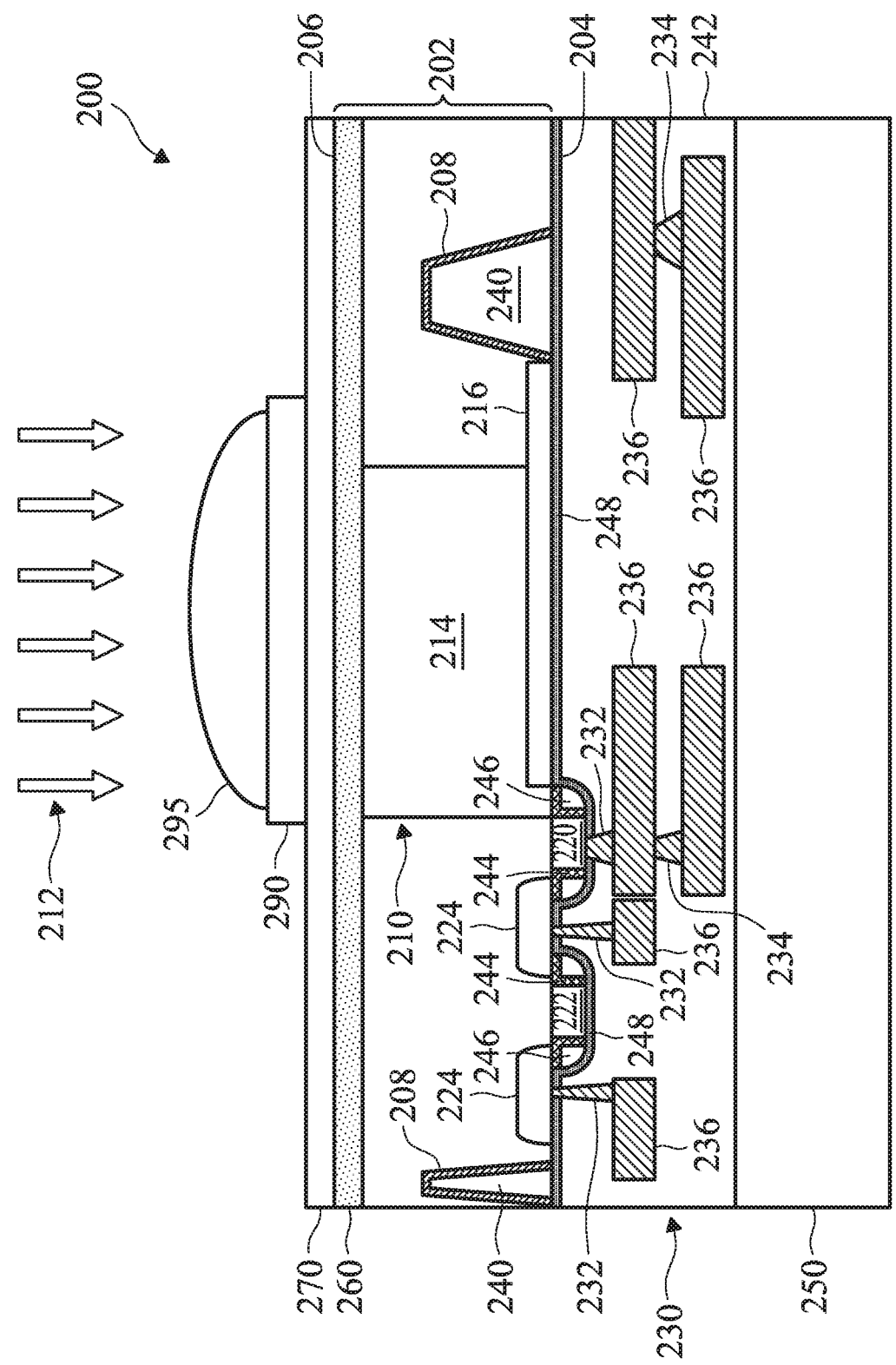
FIG. 2 is a diagrammatic sectional side view of an integrated circuit device including an image sensor device sensor element according to various aspects of the present disclosure.

A description of the back side illuminated (BSI) CMOS image sensor (CIS) device in accordance with various negatively-charged layer embodiments of the present disclosure is discussed in association with FIGS. 1 and 2. FIG. 1 is a top view of an image sensor device 100 according to various aspects of the present disclosure. In the depicted embodiment, the image sensor device is a backside illuminated (BSI) image sensor device. The image sensor device 100 includes an array of pixels 110. Each pixel 110 is arranged into a column (for example, C1 to Cx) and a row (for example, R1 to Ry). The term "pixel" refers to a unit cell containing features (for example, a photodetector and various circuitry, which may include various semiconductor devices) for converting electromagnetic radiation to an electrical signal. The pixels 110 may include photodiodes, complementary metal-oxide-semiconductor (CMOS) image sensors, charged coupling device (CCD) sensors, active sensors, passive sensors, other sensors, or future-developed image sensing devices. The pixels 110 may be designed having various sensor types. For example, one group of pixels 110 may be CMOS image sensors and another group of pixels 110 may be passive sensors. Moreover, the pixels 110 may include color image sensors and/or monochromatic image sensors. In an example, each pixel 110 is an active pixel sensor, such as a complementary metal-oxide-semiconductor (CMOS) image sensor. In the depicted embodiment, each pixel 110 may include a photodetector, such as a photogate-type photodetector, for recording an intensity or brightness of light (radiation). Each pixel 110 may also include various semiconductor devices, such as various transistors including a transfer transistor, a reset transistor, a source-follower transistor, a select transistor, other suitable transistor, or combinations thereof. Additional circuitry, input, and/or output may be coupled to the pixel array to provide an operation environment for the pixels 110 and support external communications with the pixels 110. For example, the pixel array may be coupled with readout circuitry and/or control circuitry. For simplicity, image sensor devices including a single pixel are described in the present disclosure; however, typically an array of such pixels form the image sensor device 100 illustrated in FIG. 1.

FIG. 2 is a diagrammatic cross-sectional view of an integrated circuit device 200 according to various aspects of the present disclosure. In the depicted embodiment, integrated circuit device 200 includes a backside illuminated (BSI) image sensor device. The integrated circuit device 200 may be an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. FIG. 2 has been simplified for the sake of clarity to better understand the inventive concepts of the present disclosure. Additional features can be added in the integrated circuit device 200, and some of the features described below can be replaced or eliminated for other embodiments of the integrated circuit device 200.

In FIG. 2, the integrated circuit device 200 includes a substrate 202 having a front surface 204 and a back surface 206. In the depicted embodiment, the substrate 202 is a semiconductor substrate including silicon. Alternatively or additionally, the substrate 202 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. According to one or more embodiments, the substrate 202 is a semiconductor on insulator (SOI). The substrate 202 includes a doped epi layer, a gradient semiconductor layer, and/or a semiconductor layer overlying another semiconductor layer of a different type, such as a silicon layer on a silicon germanium layer. In the depicted embodiment, the substrate 202 is a p-type substrate. P-type dopants with which the substrate 202 are doped with include boron, gallium, indium, other suitable p-type dopants, or combinations thereof. Because the depicted integrated circuit device 200 includes a p-type doped substrate, doping configurations described below are consistent with a p-type doped substrate. In one or more embodiments, the substrate 202 is an n-type doped substrate, in which case, the doping configurations described below are consistent with an n-type doped substrate (for example, doping configurations having an opposite conductivity). The n-type doped substrate includes n-type dopants including phosphorus, arsenic, other suitable n-type dopants, or combinations thereof. According to one or more embodiments, the substrate 202 includes various p-type doped regions and/or n-type doped regions regardless of the substrate doping type. Doping may be implemented using a process such as ion implantation or diffusion in various steps and techniques.

The substrate 202 includes isolation features 240, such as local oxidation of silicon (LOCOS) and/or shallow trench isolation (STI), to separate (or isolate) various regions and/or devices formed on or within the substrate 202. For example, the isolation features 240 isolate a sensor element 210 from adjacent sensor elements. In the depicted embodiment, the isolation features 240 are STIs. The isolation features 240 include a negatively-charged layer liner 208 around an insulating material such as silicon oxide, silicon nitride, silicon oxynitride, other insulating material, or combinations thereof. The isolation features 240 are formed first by depositing or forming a thin negatively-charged liner 208 followed by a deposition of the insulating material by any suitable process. As one example, forming an STI includes a photolithography process, etching a trench in the substrate (such as by using a dry etching, wet etching, or combinations thereof), forming a thin negatively-charged layer 208 in the trench, and filling the trench (for example, by using a chemical vapor deposition process) with one or more dielectric materials. In some examples, the filled trench may have additional layers, such as a thermal oxide layer (not shown) between the insulating material and the negatively-charged liner 208. The STI formation additionally includes using chemical mechanical polishing (CMP) processing to etch back and planarize.

As noted above, the integrated circuit device 200 includes the sensor element (or sensor pixel) 210. The sensor element 210 detects an intensity (brightness) of radiation, such as incident radiation (light) 212, directed toward the back surface 206 of the substrate 202. The incident radiation is visual light. Alternatively, the radiation 212 is infrared (IR), ultraviolet (UV), x-ray, microwave, other suitable radiation type, or combinations thereof. The sensor element 210 is configured to correspond with a specific light wavelength, such as a red, a green, or a blue light wavelength. In other words, the sensor element 210 is configured to detect an intensity (brightness) of a particular light wavelength. In the depicted embodiment, the sensor element 210 is a pixel included in a pixel array, such as the pixel array illustrated in FIG. 1. In the depicted embodiment, the sensor element 210 includes a photodetector, such as a photodiode, that includes a light-sensing region (or photo-sensing region) 214 and a pinned layer 216. The light-sensing region (or photo-sensing region) 214 is a doped region having n-type and/or p-type dopants formed in the substrate 202, specifically along the front surface 204 of the substrate 202. In the depicted embodiment, the light-sensing region 214 is an n-type doped region. The light-sensing region 214 is formed by a method such as diffusion and/or ion implantation. The pinned layer 216 is a doped layer disposed at the front surface 204 of the substrate 202. For example, in the depicted embodiment, the pinned layer 216 is a p-type implanted layer.

The sensor element 210 further includes various transistors, such as a transfer transistor associated with a transfer gate 220, a reset transistor associated with a reset gate 222, a source-follower transistor (not illustrated), a select transistor (not illustrated), other suitable transistors, or combinations thereof. The light-sensing region 214 and various transistors (which can collectively be referred to as pixel circuitry) allow the sensor element 210 to detect intensity of the particular light wavelength. Additional circuitry, input, and/or outputs may be provided to the sensor element 210 to provide an operation environment for the sensor element 210 and/or support communication with the sensor element 210.

The various transistor gates in the pixel circuitry, including transfer gate 220 and the reset gate 222 are disposed over the front surface 204 of the substrate 202. The transfer gate 220 interposes a source/drain region 224 of the substrate 202 and the light-sensing region 214, such that a channel is defined between the source/drain region 224 and the light-sensing region 214. The reset gate 222 interposes source/drain regions 224 of the substrate 202, such that a channel is defined between two source/drain regions 224. In the depicted embodiment, the source/drain regions 224 are N+ source/drain diffusion regions. The source/drain regions 224 may be referred to as floating diffusion regions. The transfer gate 220 and reset gate 222 include a gate stack having a gate dielectric layer and a gate electrode. The gate dielectric layer includes a dielectric material, such as silicon oxide, a high-k dielectric material, other dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other high-k dielectric material, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive material, or combinations thereof. The transfer gate 220 and reset gate 222 include spacer structures disposed on the sidewalls of the gate stacks. The spacer structures include a gate offset spacer and/or a gate sidewall spacer (together shown as element 244), and a sidewall spacer 246. The gate offset spacer is the layer closest to the gate, followed by a gate sidewall spacer, if used. According to one or more embodiments, the spacer structure 244 (i.e., the gate offset spacer and the gate sidewall spacer) is a negatively-charged layer. The spacer structure 244 may be different oxides. The sidewall spacer 246 may be a silicon nitride, silicon oxynitride, other suitable material, or combinations thereof in a multi-layer structure. The transfer gate 220 and the reset gate 222 are formed by a suitable process, including deposition, lithography patterning, and etching processes.

According to one or more embodiments, a salicide-block layer is over portions of the transistors in the pixel circuitry and the photodiode to block salicides from forming during the semiconductor processing when salicides are formed in other portions of the device. In some embodiments, metal silicides are unwanted around the photodiode because a reduction in quantum efficiency may result. Thus, a salicide-block layer 248 of an insulating material is formed over portions of the transistors (e.g., the transfer transistor having the transfer gate 220 and the reset transistor having the reset gate 222) and the photodiodes to prevent a transition metal from contacting the exposed silicon during the metal silicide formation process. Because the metal does not react with insulating material, the salicide formation is blocked. The metal is subsequently removed in an etching process. The salicide-block layer 248 is a negatively-charged layer or includes a negatively-charged layer as a buffer layer under the salicide-block layer 248. In some embodiments, the salicide-block layer 248 is used only around the photodiode and not over transistor gates such as gates 222 and 220. In some embodiments, the salicide-block layer 248 is used over transistor gates that are proximate to the photodiode, such as transfer gate 220, but not over reset gate 222.

The integrated circuit device 200 further includes a multilayer interconnect (MLI) 230 disposed over the front surface 204 of the substrate 202, including over the sensor element 210. The MLI 230 is coupled to various components of the BSI image sensor device, such as the sensor element 210, such that the various components of the BSI image sensor device are operable to properly respond to illuminated light (imaging radiation). The MLI 230 includes various conductive features, which may be vertical interconnects, such as contacts 232 and/or vias 234, and/or horizontal interconnects, such as lines 236. The various conductive features 232, 234, and 236 include conductive materials, such as metal. In an example, metals including aluminum, aluminum/silicon/copper alloy, titanium, titanium nitride, tungsten, polysilicon, metal silicide, or combinations thereof, may be used, and the various conductive features 232, 234, and 236 may be referred to as aluminum interconnects. Aluminum interconnects may be formed by a process including physical vapor deposition (PVD), chemical vapor deposition (CVD), or combinations thereof. Other manufacturing techniques to form the various conductive features 232, 234, and 236 may include photolithography processing and etching to pattern conductive materials to form the vertical and horizontal connects. Still other manufacturing processes may be implemented to form the MLI 230, such as a thermal annealing to form metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, the various conductive features 232, 234, and 236 may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. The MLI 230 is not limited by the number, material, size, and/or dimension of the conductive features 232, 234, 236 depicted, and thus, the MLI 230 may include any number, material, size, and/or dimension of conductive features depending on design requirements of the integrated circuit device 200.

The various conductive features 232, 234, and 236 of the MLI 230 are disposed in an interlayer (or inter-level) dielectric (ILD) layer 242. The ILD layer 242 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable material, or combinations thereof. The ILD layer 242 may have a multilayer structure. The ILD layer 242 may be formed by a technique including spin-on coating, CVD, sputtering, or other suitable process. In an example, the MLI 230 and ILD 242 may be formed in an integrated process including a damascene process, such as a dual damascene process or single damascene process.

A carrier wafer 250 is disposed over the front surface 204 of the substrate 202. In the depicted embodiment, the carrier wafer 250 is bonded to the MLI 230. The carrier wafer 250 includes silicon. Alternatively, the carrier wafer 250 includes another suitable material, such as glass. The carrier wafer 250 can provide protection for the various features (such as the sensor element 210) formed on the front surface 204 of the substrate 202, and can also provide mechanical strength and support for processing the back surface 206 of the substrate 202.

A backside treatment layer 260 is disposed at the back surface 206 of the substrate 202. According one or more embodiments, the backside treatment layer 260 is a negatively-charged layer, and may also include a doped layer formed by an implantation process, diffusion process, annealing process, other process, or combinations thereof. A doped layer includes p-type dopants, such as boron, and may be a P+ doped layer. The doped layer may include other p-type dopants, such as gallium, indium, other p-type dopants, or combinations thereof.

The integrated circuit device 200 further includes features disposed over the back surface 206 of the substrate 202. For example, an anti-reflective layer 270, a color filter 290, and a lens 295 are disposed over the back surface 206 of the substrate 202. In the depicted embodiment, the anti-reflective layer 270 is disposed between the back surface 206 of the substrate 202 and the color filter 290. The antireflective layer 270 includes a dielectric material, such as silicon nitride, silicon oxynitride or high-k metal oxides.

The color filter 290 is disposed over the back surface 206 of the substrate 202, particularly over the anti-reflective layer 270, and is aligned with the light-sensing region 214 of the sensor element 210. The color filter 290 is configured to filter through light of a predetermined wavelength. For example, the color filter 290 filters through visible light of a red wavelength, a green wavelength, or a blue wavelength to the sensor element 210. The color filter 290 includes any suitable material. In an example, the color filter 290 includes a dye-based (or pigment-based) polymer for filtering out a specific frequency band (for example, a desired wavelength of light). Alternatively, the color filter 290 includes a resin or other organic-based material having color pigments.

The lens 295, disposed over the back surface 206 of the substrate 202, particularly over the color filter 290, and is also aligned with the light-sensing region 214 of the sensor element 210. The lens 295 may be in various positional arrangements with the sensor element 210 and color filter 290, such that the lens 295 focuses the incident radiation 212 on the light sensing region 214 of the sensor element 210. The lens 295 includes a suitable material, and may have a variety of shapes and sizes depending on an index of refraction of the material used for the lens and/or a distance between the lens and sensor element 210. Alternatively, the position of the color filter 290 and lens 295 may be reversed, such that the lens 295 is disposed between the anti-reflective layer 270 and color filter 290. The present disclosure also contemplates the integrated circuit device 200 having a color filter layer disposed between lens layers.

In operation, the integrated circuit device 200 is designed to receive radiation 212 traveling towards the back surface 206 of the substrate 202. The lens 295 directs the incident radiation 212 to the color filter 290. The light then passes from the color filter 290 through the anti-reflective layer 270 to the substrate 202 and corresponding sensor element 210, specifically to the light sensing region 214. Light passing through to the color filter 290 and sensor element 210 may be maximized since the light is not obstructed by various device features (for example, gates electrodes) and/or metal features (for example, the conductive features 232, 234, and 236 of the MLI 230) overlying the front surface 204 of the substrate 202. The desired wavelength of light (for example, red, green, and blue light) that is allowed to pass through to the light-sensing region 214 of the sensor element 210. When exposed to the light, the light-sensing region 214 of the sensor element 210 produces and accumulates (collects) electrons as long as the transfer transistor associated with transfer gate 220 is in an "off" state. When the transfer gate 220 is in an "on" state, the accumulated electrons (charge) can transfer to the source/drain region (floating diffusion region) 224. A source-follower transistor (not illustrated) may convert the charge to voltage signals. According to one or more embodiments, prior to charge transfer, the source/drain regions 224 are set to a predetermined voltage by turning on the reset transistor associated with reset gate 222. In an example, the pinned layer 216 and the doped layer 260 have a same potential, such as a potential of the substrate 202, such that the light-sensing region 214 is fully depleted at a pinning voltage ($V_{PIN}$) and a potential of the sensor element 210 is pinned to a constant value, $V_{PIN}$, when the light-sensing region 214 is fully depleted.

Figure 3:
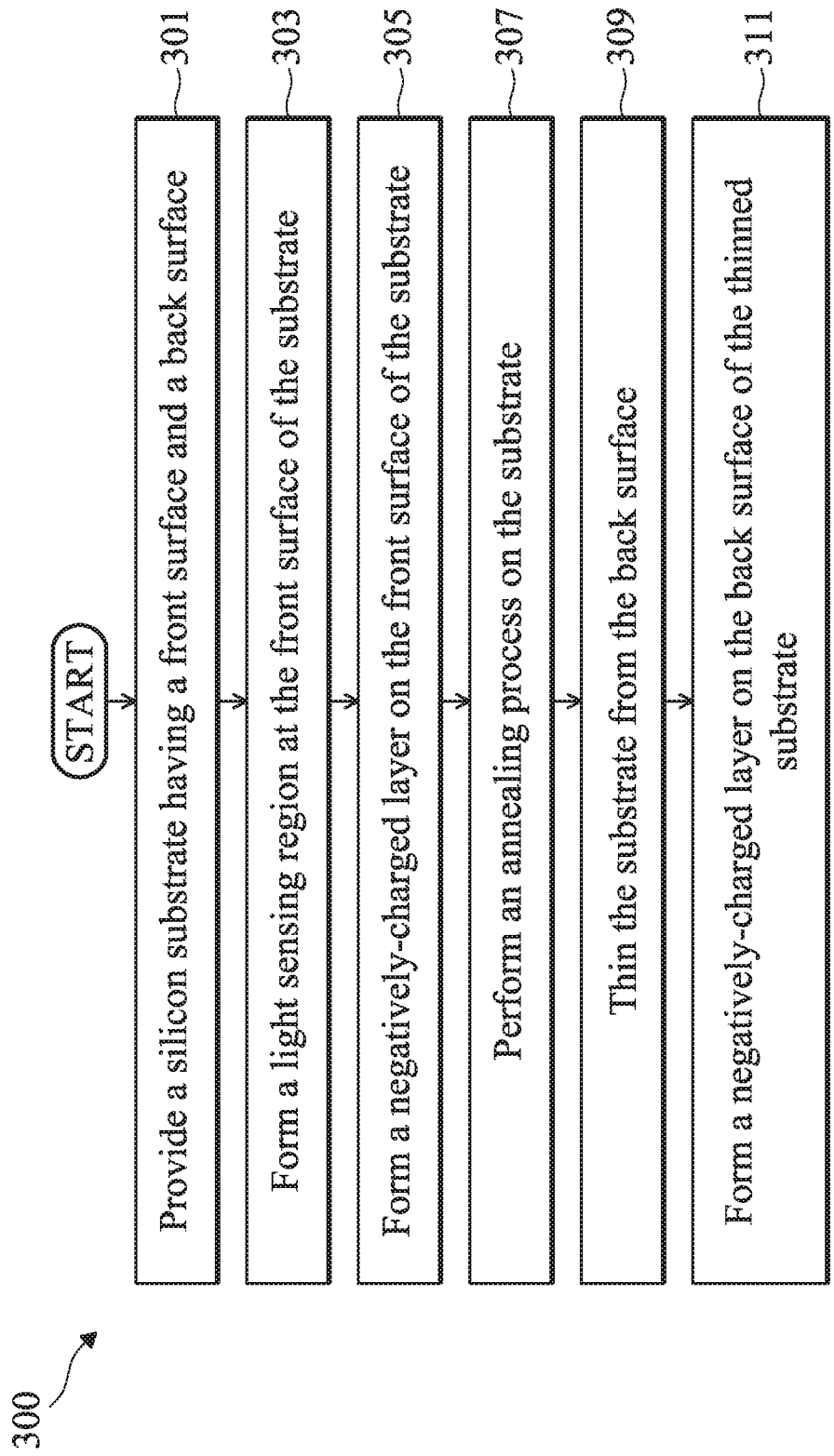
FIG. 3 is a flow chart of a method for fabricating an integrated circuit device including an image sensor device according to various aspects of the present disclosure.

FIG. 3 is a flow chart of a method for fabricating an integrated circuit device including an image sensor device according to various aspects of the present disclosure. In FIG. 3, the method 300 begins at block 301 where a substrate having a front surface and a back surface, or a first surface and a second surface, is provided. The substrate is a semiconductor substrate including silicon and may include a doped epi layer, a gradient semiconductor layer, and/or a semiconductor layer overlying another semiconductor layer of a different type, such as a silicon layer on a silicon germanium layer. In some embodiments, the substrate is a p-type substrate doped with boron, gallium, indium, other suitable p-type dopants, or combinations thereof.

At block 303, a light-sensing region is formed at the front surfaces of the substrate. The light-sensing region includes a photodetector, such as a photodiode. The light-sensing region (or photo-sensing region) is a doped region having n-type and/or p-type dopants formed in the substrate. The light-sensing region is formed by a method such as diffusion and/or ion implantation.

At block 305, one or more negatively-charged layers are formed on the front surface of the substrate. Depending on where the negatively-charged layer is, the layer is formed before or after the light-sensing region. In some embodiments, the negatively-charged layer is a shallow trench isolation (STI) liner formed before the photodiode implantation. Trenches are etched in the substrate and a negatively-charged liner is deposited in the trenches to cover the sides the bottom of the trenches. The STI is then filled with silicon oxide. The substrate is planarized using a chemical mechanical polishing (CMP) process before implantation or diffusion operations to create the light-sensing regions.

The one or more negatively-charged layers may be formed after the light-sensing region. One or more transistor gates may be formed around the light-sensing region by first depositing a gate dielectric and then growing a polysilicon or depositing a gate stack. The gates are formed by etching or removing unwanted portions. In some embodiments, a thin film of negatively-charged layer may be deposited over the gates as an offset or sidewall spacer on around the gate. The offset spacer aligns a subsequent ion implantation for the transistor formation and/or photodiode implantation a distance equal to the offset spacer thickness away from gate walls. Another film of negatively-charged layer may be deposited next to the offset spacer to line agate spacer, which is deposited over this negatively-charged layer and etched. Another ion implantation then takes place that aligns the area implanted against the gate spacer In some embodiments, the one or more negatively-charged layers include a buffer layer under a salicide-block layer. As noted above, a salicide-block layer is used to prevent metal silicidation over or around a photodiode. In some embodiments, the negatively-charged layer is the salicide-block layer. In other embodiments where the negatively-charged layer is a buffer layer, then a salicide-block layer is deposited.

The block 307, an anneal is performed on the substrate to activate the various implanted dopants. The anneal process heats the substrate to a temperature greater than about 800 degrees Celsius in an inert environment. In some embodiments, the annealing occurs for a few minutes. In certain embodiments, the anneal occurs for more than half hour or for more than one hour. In one embodiment, the annealing occurs at 1100 degrees Celsius for 2 hours. The annealing can reduce the cumulated negative charge in the one or more negatively-charged layers. According to various embodiments, cumulated negative charge is retained after the annealing operation. The total negative charge after annealing is greater than about $1E10/cm^2$, or greater than about $4E11/cm^2$, or is about $5E11/cm^2$.

Figure 4:
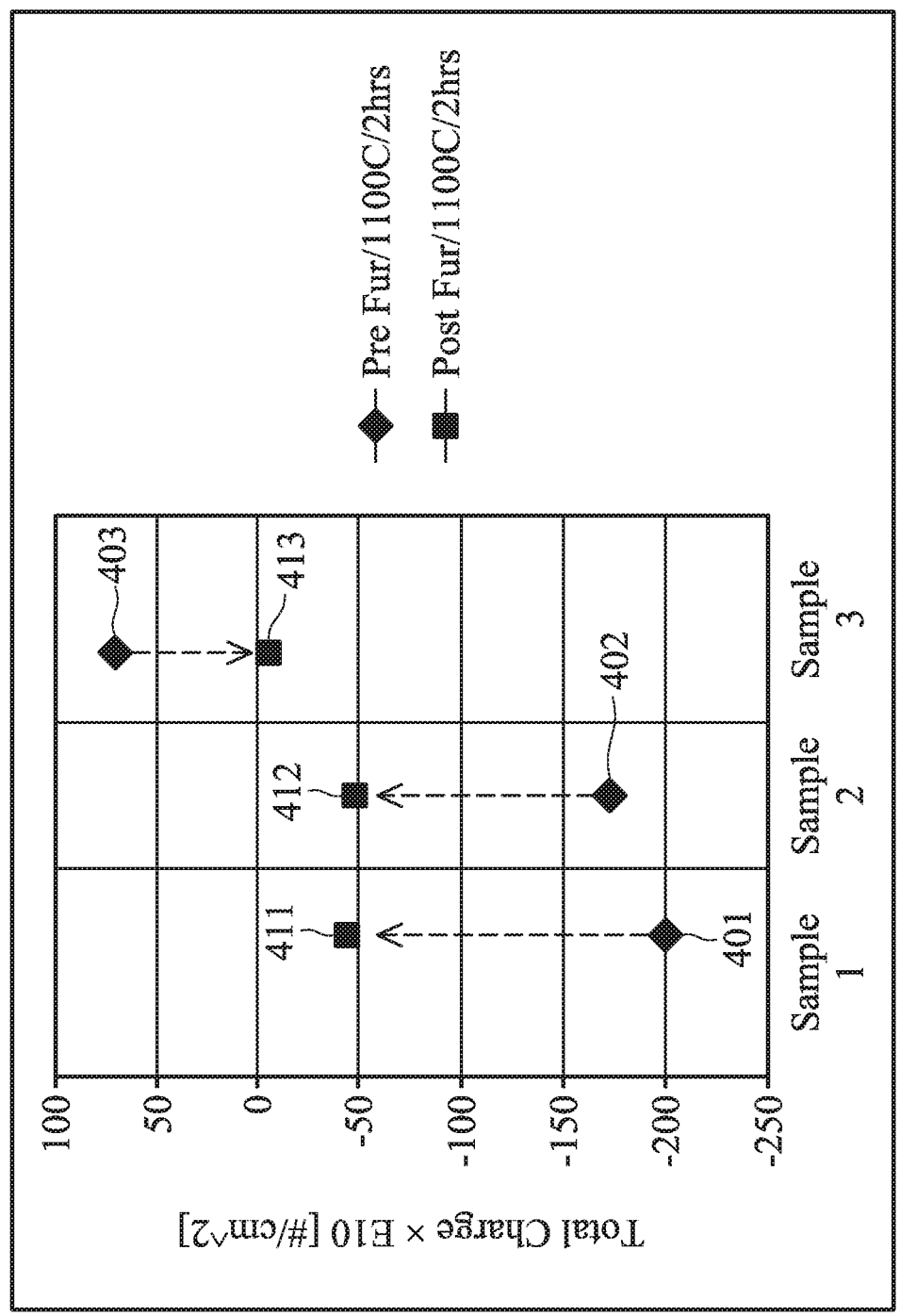
FIG. 4 is a graph of total charge for one kind of negatively-charged layer and traditional silicon oxide typically used as a liner oxide in shallow trench isolations (STIs) in accordance with various embodiments of the present disclosure.

FIG. 4 is a graph of total charge for one kind of negatively-charged layer and traditional silicon oxide typically used as a liner oxide in STIs. Three films were prepared and subjected to a furnace anneal at 1100 degrees Celsius for 2 hours. Samples 1 and 2 are oxygen-rich silicon oxide film deposited using a low temperature plasma with oxygen radical oxidation. As deposited, the samples had a total charge of greater than $-150E10/cm^2$ (see both data points 401 and 402). Sample 1 had a total charge of about $-200E10/cm^2$ at data point 401. After the furnace anneal, the total charge became more positive as shown by the dotted arrow lines, to about $-50E10/cm^2$, data points 411 and 412 The furnace anneal may repair dangling or broken bonds or promoted escaping of intestinal oxygen, both of which would cause the negatively-charged layer to lose negative charge. Sample 3 is a silicon oxide film typically used as a liner for STI features. As deposited, the sample had a total positive charge of greater than 50E10/cm² at data point 403. After annealing, Sample 3 became slightly negative at data point 413, but not by much as compared to the negatively-charged layers.

The negative charge retention is important for negatively-charged layers used on the front side of the substrate because the dopant activation anneal is necessary for device formation. As suggested by Sample 1 and 2 of FIG. 4, a greater negative charge in the negatively-charged layer can be maintained if the annealing process can be performed before the negatively-charged layer deposition. Thus in some embodiments, the salicide-block layer including a negatively-charged layer may be deposited after the anneal.

Referring back to FIG. 3, in block 309 the substrate is thinned from the back surface after the image sensor device formation. The image sensor device is completed after forming backend of line processes including forming interconnect structures and passivation. A carrier wafer is attached to the front surface of the substrate and then the back side thinned. A multi-step process may be used, for example, a multi-step process that includes grinding, polishing, and etching (dry etching, wet etching, or a combination thereof).

In block 311, a negatively-charged layer may be formed on the back surface of the thinned substrate in addition or instead of a p-type doped layer. The negatively-charged layer on the back surface may be between about 10 to about 100 angstroms and located between the antireflective layer and the photodiodes (e.g., the sensing element).

Therefore, in some embodiments, the present disclosure relates to a charged layer arranged proximate to radiation-sensing regions in a BSI image sensor and configured increase charge carrier accumulation along edges of the charged layer. The accumulated charge carriers improve image sensor performance by reducing dark current in the image sensor.

In some embodiments, the present disclosure relates to a semiconductor image sensor device. The device includes a semiconductor substrate having a first surface configured to receive incident radiation. A plurality of sensor elements are arranged within the semiconductor substrate and a first charged layer is disposed on an entirety of a second surface of the semiconductor substrate facing an opposite direction as the first surface. The second surface is between the first charged layer and the first surface of the semiconductor substrate.

In other embodiments, the present disclosure relates to a semiconductor image sensor device. The device includes a substrate having a back surface configured to receive incident radiation. A plurality of sensor elements are arranged within the substrate, and a plurality of transistor gates are arranged along a front surface of the substrate. A first charged layer extends along the front surface of the substrate over the plurality of sensor elements and the plurality of transistor gates. The front surface of the substrate is between the first charged layer and the back surface of the substrate.

In yet other embodiments, the present disclosure relates to a semiconductor image sensor device. The device includes a substrate and a plurality of sensor elements arranged within the substrate. A plurality of transistor gates are arranged along a front surface of the substrate and a first charged layer extends along the front surface of the substrate over the plurality of sensor elements and between adjacent ones of the plurality of transistor gates. The front surface of the substrate is between the first charged layer and a back surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor image sensor device, comprising:
   a semiconductor substrate having a first surface and a second surface, wherein the first surface is configured to receive incident radiation prior to the second surface;
   a plurality of photodetectors arranged within the semiconductor substrate;
   a doped layer arranged along the first surface of the semiconductor substrate, wherein the plurality of photodetectors are respectively defined by outer boundaries intersecting a bottom of the doped layer that faces the second surface; and
   a first charged layer disposed along the second surface of the semiconductor substrate facing an opposite direction as the first surface, wherein the first charged layer comprises a same silicon oxide material continuously extending between a top of the first charged layer and a bottom of the first charged layer, and wherein the second surface is between the first charged layer and the first surface of the semiconductor substrate.

2. The device of claim 1, further comprising:
   a plurality of transistor gates arranged along the second surface of the semiconductor substrate; and
   a conductive contact arranged within an interlayer dielectric (ILD) structure separated from the second surface of the semiconductor substrate by the first charged layer, wherein the first charged layer directly contacts the plurality of transistor gates and the plurality of photodetectors, and wherein the conductive contact extends through the first charged layer to one of the plurality of transistor gates.

3. The device of claim 1, wherein the first charged layer comprises a silicide blocking layer.

4. The device of claim 1, further comprising:
   a plurality of shallow trench isolation features arranged within a plurality of trenches extending into the second surface of the semiconductor substrate between the plurality of photodetectors, wherein the first charged layer contacts surfaces of the plurality of shallow trench isolation features facing away from the semiconductor substrate; and
   a second charged layer extending into the plurality of trenches and separating the plurality of shallow trench isolation features from the semiconductor substrate.

5. The device of claim 4, wherein the first charged layer extends along the second surface over the plurality of shallow trench isolation features and the second charged layer.

6. The device of claim 1, wherein the doped layer is disposed along an entirety of the first surface of the semiconductor substrate.

7. The device of claim 1, wherein the first charged layer comprises an oxygen-rich silicon oxide or a high-k metal oxide.

8. The device of claim 1, wherein the first charged layer and the doped layer have a same charge polarity.

9. The device of claim 8, further comprising:
an anti-reflective layer disposed on the first surface of the substrate, wherein the doped layer has a first surface directly contacting the plurality of photodetectors and an opposing second surface directly contacting the anti-reflective layer.

10. The device of claim 1,
wherein the plurality of photodetectors respectively comprise a first region having a p-type doping and a second region having an n-type doping, the second region between the first region and the second surface of the semiconductor substrate; and
wherein the doped layer has the p-type doping along a bottommost boundary of the doped layer, the bottommost boundary of the doped layer directly contacting a topmost boundary of the second region.

11. An image sensor device, comprising:
a substrate having a back surface and a front surface, wherein the back surface is configured to receive incident radiation prior to the front surface;
a plurality of sensor elements arranged within the substrate;
a plurality of transistor gates arranged along the front surface of the substrate;
a first charged layer extending along the front surface of the substrate over the plurality of sensor elements and the plurality of transistor gates, wherein the front surface of the substrate is between the first charged layer and the back surface of the substrate and wherein the first charged layer is an oxide;
a plurality of sidewall spacers laterally separating the plurality of transistor gates from the first charged layer; and
a plurality of sidewall spacer structures comprising a negatively charged layer that laterally separates a sidewall of one of the plurality of sidewall spacers from a sidewall of an adjacent one of the plurality of transistor gates and vertically separates a bottom of the one of the plurality of sidewall spacers from the front surface of the substrate.

12. The device of claim 11, wherein the first charged layer continuously extends along the front surface of the substrate between the plurality of sensor elements and directly contacts the plurality of transistor gates.

13. The device of claim 11, wherein the first charged layer is arranged along opposing sides of respective ones of the plurality of transistor gates.

14. The device of claim 11, further comprising:
a transfer transistor disposed along the front surface of the substrate between a first sensor element of the plurality of sensor elements and a first side of a diffusion region within the substrate; and
a reset transistor disposed along the front surface of the substrate along a second side of the diffusion region opposite the first side, the first charged layer disposed on the transfer transistor and not on the reset transistor.

15. The device of claim 11, further comprising:
a plurality of isolation features arranged within a plurality of trenches extending into the front surface of the substrate between the plurality of sensor elements; and
a second charged layer extending into the plurality of trenches and separating the plurality of isolation features from the substrate, wherein the second charged layer is laterally separated from a side of a closest one of the plurality of sensor elements by a non-zero distance, the side facing towards the second charged layer.

16. The device of claim 15, wherein the first charged layer has a total charge of about $-50E10/cm^2$.

17. The device of claim 11, wherein the first charged layer comprises an oxygen-rich silicon oxide, a high-k metal oxide, or a nitride material.

18. An image sensor device, comprising:
a substrate;
a plurality of sensor elements arranged within the substrate;
a plurality of transistor gates arranged along a front surface of the substrate;
a plurality of isolation features arranged within a plurality of trenches extending into the front surface of the substrate between the plurality of sensor elements;
a first charged layer extending along the front surface of the substrate over the plurality of sensor elements and between adjacent ones of the plurality of transistor gates, wherein the front surface of the substrate is between the first charged layer and a back surface of the substrate and wherein the first charged layer contacts surfaces of the plurality of shallow trench isolation features facing away from the substrate;
a doped layer arranged along the back surface of the substrate, wherein the plurality of isolation features are separated from the doped layer by one or more non-zero distances; and
a second charged layer extending into the plurality of trenches and separating the plurality of isolation features from the substrate.

19. The device of claim 18, further comprising:
a multilayer interconnect arranged along the front surface of the substrate, wherein the first charged layer is arranged between the plurality of transistor gates and the multilayer interconnect, and wherein the multilayer interconnect comprises conductive contacts extending through the first charged layer to the plurality of transistor gates.

20. The device of claim 18, wherein the second charged layer is completely confined within the plurality of trenches.

* * * * *